United States Patent
Sehgal et al.

(10) Patent No.: US 9,673,819 B2
(45) Date of Patent: Jun. 6, 2017

(54) METASTABILITY GLITCH DETECTION

(71) Applicant: Mentor Graphics Corporation, Wilsonville, OR (US)

(72) Inventors: Rajeev Sehgal, Noida (IN); Srinivas Mandavilli, Hyderabad (IN); Pradish Mathews, Noida (IN); Ajit Singh, Delhi (IN); Henry Potts, Ft. Collins, CO (US)

(73) Assignee: Mentor Graphics Corporation, Wilsonville, OR (US)

(*) Notice: Subject to any disclaimer, the term of this patent is extended or adjusted under 35 U.S.C. 154(b) by 0 days.

(21) Appl. No.: 14/473,922

(22) Filed: Aug. 29, 2014

(65) Prior Publication Data

US 2015/0214933 A1 Jul. 30, 2015

(30) Foreign Application Priority Data

Jan. 30, 2014 (IN) .............................. 439/CHE/2014

(51) Int. Cl.

| | |
|---|---|
| *H03K 19/0175* | (2006.01) |
| *H03K 9/08* | (2006.01) |
| *H03K 3/02* | (2006.01) |
| *H03K 19/096* | (2006.01) |
| *H03K 3/013* | (2006.01) |
| *G01R 19/165* | (2006.01) |

(Continued)

(52) U.S. Cl.
CPC ............... *H03K 19/017509* (2013.01); *G01R 19/16504* (2013.01); *G06F 11/14* (2013.01); *H03K 3/013* (2013.01); *H03K 3/0375* (2013.01); *H03K 19/096* (2013.01)

(58) Field of Classification Search
CPC ........ H04L 1/00; G11B 20/18; H03K 3/0375; H03K 5/1252; H03K 19/003; H03K 3/013; H03K 5/1534; H03K 19/096; H03K 19/017509; G06F 11/14
See application file for complete search history.

(56) References Cited

U.S. PATENT DOCUMENTS 4,353,032 A * 10/1982 Taylor ................ G01R 31/3177
327/20
4,968,902 A * 11/1990 Jackson ................ H04L 25/061
326/21

(Continued)

*Primary Examiner* — Vibol Tan
(74) *Attorney, Agent, or Firm* — Mentor Graphics Corporation

(57) ABSTRACT

This application discloses a system to detect meta-stable glitches in a signal, such as an output of latch or other storage element. The system can include a sampling circuit configured to sample an output of a storage element. The system can include a mono-shot circuit configured to monitor the output of the storage element and generate a pulse when the monitored output of the storage element differs from the sampled output. The system can include a drive circuit configured to generate a glitch signal based, at least in part, on the sampled output, and to output the glitch signal in response to the pulse from the mono-shot circuit. The system can include an error detection circuit configured to receive the sampled output from the sampling circuit and the glitch signal from the drive circuit, and to generate an error signal when the sampled output differs from the glitch signal.

19 Claims, 11 Drawing Sheets

(51) Int. Cl.
*G06F 11/14* (2006.01)
*H03K 3/037* (2006.01)

(56) References Cited

U.S. PATENT DOCUMENTS

| | | | | |
|---|---|---|---|---|
| 5,315,181 | A * | 5/1994 | Schowe | G06F 1/08 326/93 |
| 6,505,262 | B1 * | 1/2003 | Kurd | H03K 5/1252 327/379 |
| 6,670,832 | B1 * | 12/2003 | Duong | H03K 5/1252 327/34 |
| 6,745,337 | B1 * | 6/2004 | Trivedi | G06F 13/4072 713/400 |
| 6,842,044 | B1 * | 1/2005 | Feng | H03K 5/1252 326/22 |
| 7,911,239 | B2 * | 3/2011 | Saint-Laurent | H04L 7/0083 327/298 |
| 9,106,213 | B2 * | 8/2015 | Shimizu | H04L 9/3278 |
| 2003/0086517 | A1 * | 5/2003 | Vallet | H04L 7/0338 375/355 |
| 2010/0199136 | A1 * | 8/2010 | Patra | G01R 31/31726 714/731 |
| 2013/0314998 | A1 * | 11/2013 | Minz | H03K 5/1252 365/185.18 |

\* cited by examiner

METASTABILITY GLITCH DETECTION

TECHNICAL FIELD

This application is generally related to electronic design automation and, more specifically, to metastability glitch detection.

BACKGROUND

Programmable logic devices, such as field-programmable gate arrays (FPGAs), include integrated circuitry capable of being configured after manufacture. The development of configurations for these programmable logic devices typically involves many steps, known as a "design flow." Initially, a specification for a new circuit can be transformed into a logical circuit design, sometimes referred to as a register transfer level (RTL) description of the circuit. With this logical circuit design, the circuit can be described in terms of both the exchange of signals between hardware registers and the logical operations that can be performed on those signals. The logical circuit design typically employs a Hardware Description Language (HDL), such as the Very high speed integrated circuit Hardware Description Language (VHDL). The functionality of the logical circuit design can be verified, for example, by simulating the logical circuit design with various test scenarios and verifying that the results of the simulation correspond with an expected output from the simulated logical circuit design.

The next stage of the "design flow" involves synthesizing the logical circuit design from the register transfer level into a gate-level representation, such as a netlist. The synthesis operations can include RTL synthesis, which can generate generic gates corresponding to the functionality described in the logical circuit design, and include physical synthesis, which can map the generic gates to a target programmable logic device, for example, generating a target device-specific netlist. The functionality of a gate-level netlist also can be verified, for example, by simulating the gate-level netlist with various test scenarios and verifying that the results of the simulation correspond with an expected output from the simulated gate-level netlist.

The next stage involves implementing a place-and-route process to determine the placement of elements from the gate-level netlist in the programmable logic device and the interconnections between those elements. The place-and-route process can generate a configuration file that, when downloaded to a programmable logic device, can cause the programmable logic device to implement the circuit design described by the gate-level netlist as configured by the place-and-route process.

Since simulation during the "design flow" often fails to catch all design bugs or flaws, most "design flows" include in-system debugging and validation to monitor operation of the configured programmable logic devices—typically with special debugging tools that probe and monitor an FPGA's internal signals at system-clock speed—and detect and output any aberrant behavior via a Joint Test Action Group (JTAG) port of the programmable logic devices. One type of aberrant behavior can include a meta-stable register or flop output beyond a clock-to-output time. The meta-stable output can have a floating value for an unbounded period of time before settling, oftentimes randomly, to a logic high level or logic low level. The propagation of the meta-stable output can lead to inaccurate data propagation and ultimately a system glitch or failure. Some design validation schemes can include specialized digital circuitry to compare potentially meta-stable outputs at two future times—a half-dock period after generation and a full-clock period after generation—to ascertain whether they have a different value, indicating an occurrence of a meta-stable glitch.

When aberrant behavior, like a meta-stable glitch, is detected, the circuit designers attempt to correlate the aberrant behavior to bugs in the logical circuit design, revise the logical circuit design at the RTL-level to remove the bugs, and iterate the "design flow" with the newly revised logical circuit design, i.e., re-performing synthesis, place-and-route, verification via simulation, and programmable logic device configuration. While this iterative-based design approach can validate some designs configured into an FPGA, it often comes at the cost of large footprint consumption on the FPGA under test, excessive manual intervention, and long design-time when there are a large number of iterations. In other cases, due to lack of visibility of internal signals by the special debugging tools, bugs in the design cannot be eliminated and the circuit designers re-start the "design flow" altogether.

SUMMARY

This application discloses a system and method to detect meta-stable glitches in a signal, such as an output of latch or other storage element. The system can include a sampling circuit configured to sample an output of a storage element. The system can include a mono-shot circuit configured to monitor the output of the storage element and generate a pulse when the monitored output of the storage element differs from the sampled output. The system can include a drive circuit configured to generate a glitch signal based, at least in part, on the sampled output, and to output the glitch signal in response to the pulse from the mono-shot circuit. The system can include an error detection circuit configured to receive the sampled output from the sampling circuit and the glitch signal from the drive circuit, and to generate an error signal when the sampled output differs from the glitch signal.

This application also discloses a computing system implementing tools and mechanisms that can incorporate a validation system into a circuit design, which can detect a presence of a meta-stable glitch in an electronic device described in the circuit design. The tools and mechanisms can configure the validation system to monitor a trigger signal generated by the electronic device described in the circuit design. The tools and mechanisms can identify one or more trace signals associated with the electronic device to route to the validation system. The tools and mechanisms can configure the validation system to detect the meta-stable glitch in the monitored trigger signal generated by the electronic device, and to transmit the trace signals associated with the electronic device for debugging in response to detection of the meta-stable glitch.

DETAILED DESCRIPTION

Illustrative Operating Environment

The execution of various electronic design automation processes according to embodiments of the invention may be implemented using computer-executable software instructions executed by one or more programmable computing devices. Because these embodiments of the invention may be implemented using software instructions, the components and operation of a generic programmable computer system on which various embodiments of the invention may be employed will first be described. Further, because of the complexity of some electronic design automation processes and the large size of many circuit designs, various electronic design automation tools are configured to operate on a computing system capable of simultaneously running multiple processing threads.

Figure 1:
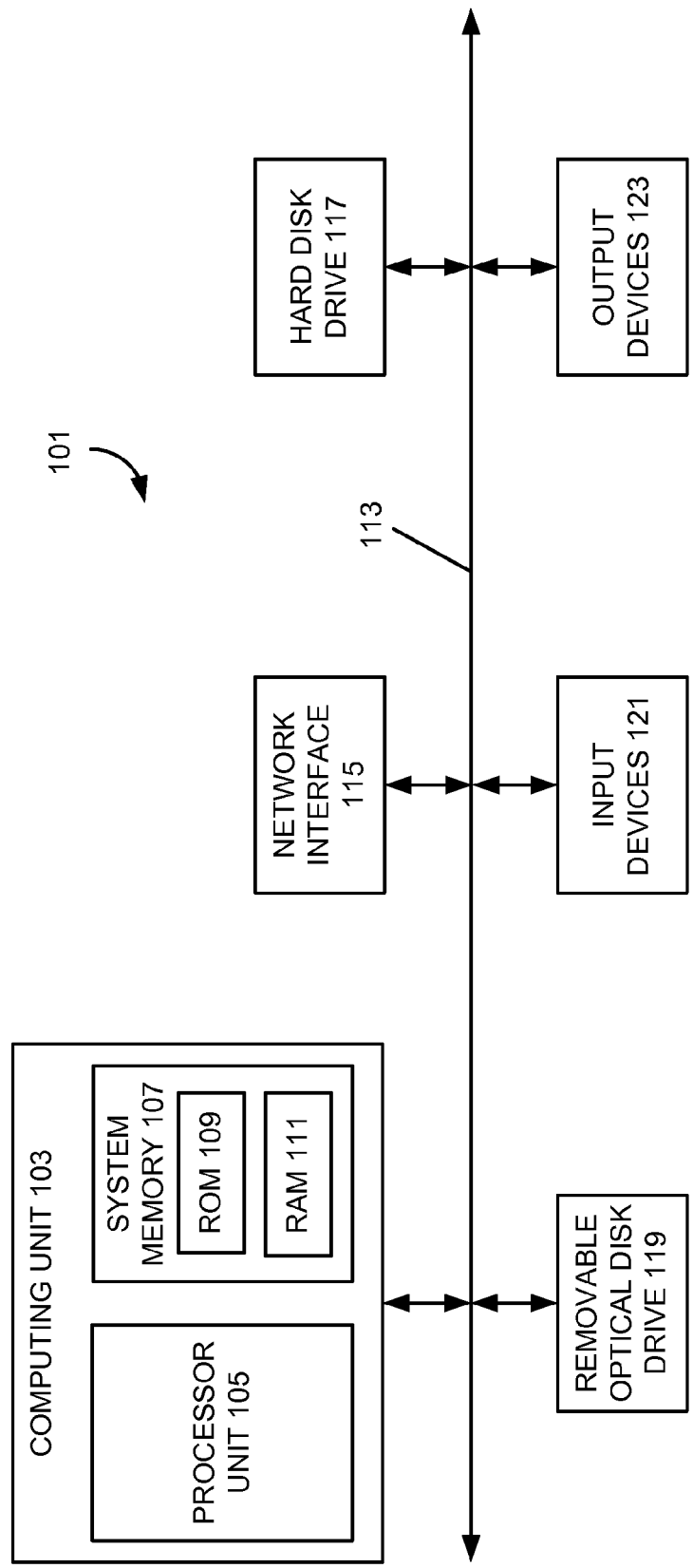
FIGS. 1 and 2 illustrate an example of a computer system of the type that may be used to implement various embodiments of the invention.

Various examples of the invention may be implemented through the execution of software instructions by a computing device, such as a programmable computer. Accordingly, FIG. 1 shows an illustrative example of a computing device 101. As seen in this figure, the computing device 101 includes a computing unit 103 with a processing unit 105 and a system memory 107. The processing unit 105 may be any type of programmable electronic device for executing software instructions, but will conventionally be a microprocessor. The system memory 107 may include both a read-only memory (ROM) 109 and a random access memory (RAM) 111. As will be appreciated by those of ordinary skill in the art, both the read-only memory (ROM) 109 and the random access memory (RAM) 111 may store software instructions for execution by the processing unit 105.

The processing unit 105 and the system memory 107 are connected, either directly or indirectly, through a bus 113 or alternate communication structure, to one or more peripheral devices. For example, the processing unit 105 or the system memory 107 may be directly or indirectly connected to one or more additional memory storage devices, such as a "hard" magnetic disk drive 115, a removable magnetic disk drive 117, an optical disk drive 119, or a flash memory card 121. The processing unit 105 and the system memory 107 also may be directly or indirectly connected to one or more input devices 123 and one or more output devices 125. The input devices 123 may include, for example, a keyboard, a pointing device (such as a mouse, touchpad, stylus, trackball, or joystick), a scanner, a camera, and a microphone. The output devices 125 may include, for example, a monitor display, a printer and speakers. With various examples of the computer 101, one or more of the peripheral devices 115-125 may be internally housed with the computing unit 103. Alternately, one or more of the peripheral devices 115-125 may be external to the housing for the computing unit 103 and connected to the bus 113 through, for example, a Universal Serial Bus (USB) connection.

With some implementations, the computing unit 103 may be directly or indirectly connected to one or more network interfaces 127 for communicating with other devices making up a network. The network interface 127 translates data and control signals from the computing unit 103 into network messages according to one or more communication protocols, such as the transmission control protocol (TCP) and the Internet protocol (IP). Also, the interface 127 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computer 101 is illustrated as an example only, and it not intended to be limiting. Various embodiments of the invention may be implemented using one or more computing devices that include the components of the computer 101 illustrated in FIG. 1, which include only a subset of the components illustrated in FIG. 1, or which include an alternate combination of components, including components that are not shown in FIG. 1. For example, various embodiments of the invention may be implemented using a multi-processor computer, a plurality of single and/or multiprocessor computers arranged into a network, or some combination of both.

Figure 2:
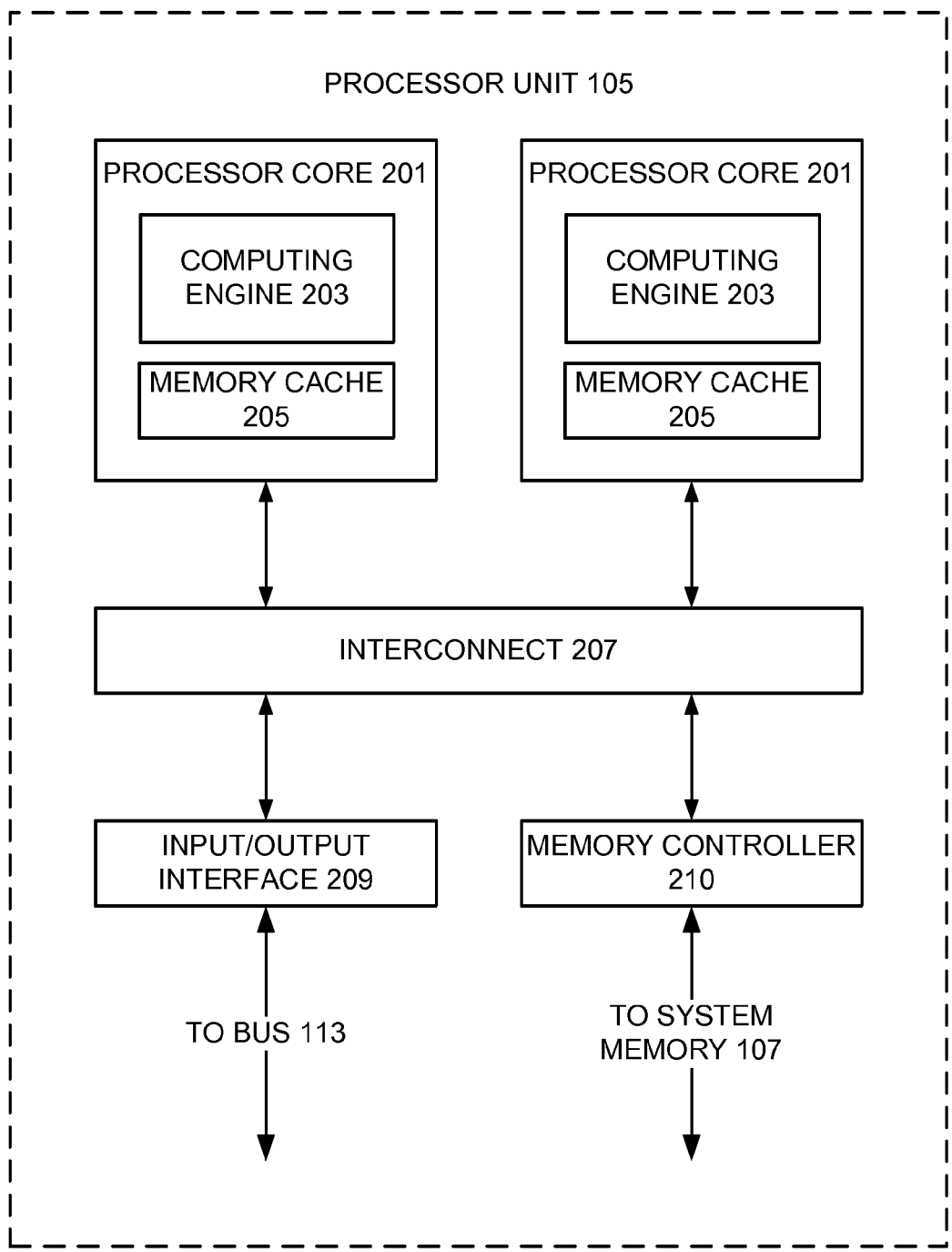

With some implementations of the invention, the processor unit 105 can have more than one processor core. Accordingly, FIG. 2 illustrates an example of a multi-core processor unit 105 that may be employed with various embodiments of the invention. As seen in this figure, the processor unit 105 includes a plurality of processor cores 201. Each processor core 201 includes a computing engine 203 and a memory cache 205. As known to those of ordinary skill in the art, a computing engine contains logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203 may then use its corresponding memory cache 205 to quickly store and retrieve data and/or instructions for execution.

Each processor core 201 is connected to an interconnect 207. The particular construction of the interconnect 207 may vary depending upon the architecture of the processor unit 201. With some processor cores 201, such as the Cell microprocessor created by Sony Corporation, Toshiba Corporation and IBM Corporation, the interconnect 207 may be implemented as an interconnect bus. With other processor units 201, however, such as the Opteron™ and Athlon™ dual-core processors available from Advanced Micro Devices of Sunnyvale, Calif., the interconnect 207 may be implemented as a system request interface device. In any case, the processor cores 201 communicate through the interconnect 207 with an input/output interface 209 and a memory controller 211. The input/output interface 209 provides a communication interface between the processor unit 201 and the bus 113. Similarly, the memory controller 211 controls the exchange of information between the processor unit 201 and the system memory 107. With some implementations of the invention, the processor units 201 may include additional components, such as a high-level cache memory accessible shared by the processor cores 201.

It also should be appreciated that the description of the computer network illustrated in FIG. 1 and FIG. 2 is provided as an example only, and it not intended to suggest any limitation as to the scope of use or functionality of alternate embodiments of the invention.

Validation Design Environment

Figure 3:
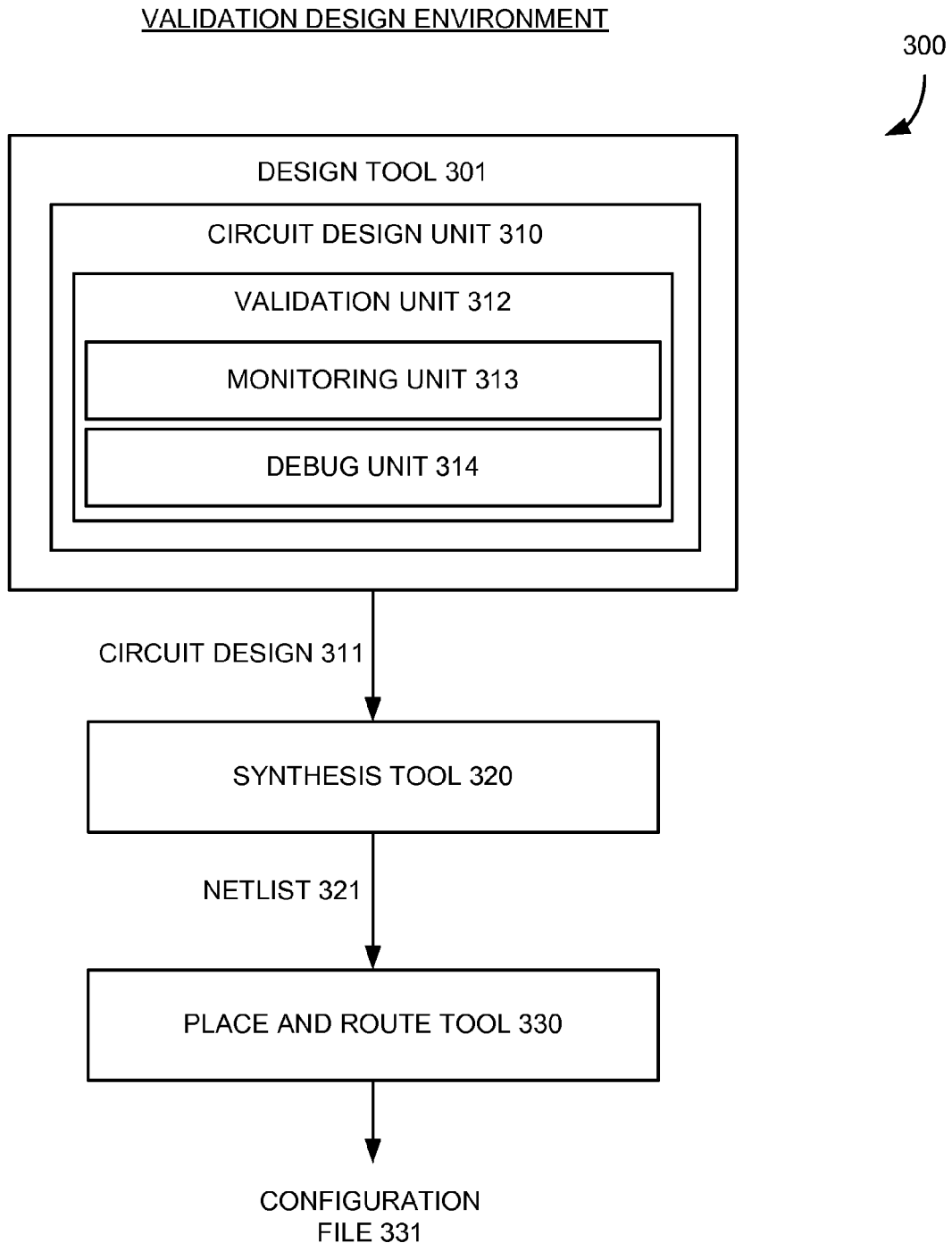
FIG. 3 illustrates an example of validation design environment including a design automation tool that can incorporate a validation system into a circuit design according to various embodiments of the invention.

FIG. 3 illustrates an example of validation design environment 300 including a design automation tool 301 that can incorporate a validation system into a circuit design 311 according to various embodiments of the invention. Referring to FIG. 3, the design tool 301 can include a circuit design unit 310 to generate the circuit design 311, which can describe an electronic device both in terms of an exchange of data signals between components in the electronic device, such as hardware registers, flip-flops, combinational logic, or the like, and in terms of logical operations that can be performed on the data signals in the electronic device. The circuit design 311 can model the electronic device at a register transfer level (RTL), for example, with code in a Hardware Description Language (HDL), such as Verilog, Very high speed integrated circuit Hardware Description Language (VHDL), or the like. In some embodiments, the design tool 301 can receive the circuit design 311 from a source external to the design tool 301, such as a user interface of the computing device 101, another tool implemented by the computing device 101.

In some embodiments, the design tool 301 (or another tool in the validation design environment 300) can simulate the circuit design 311 with a test bench. The test bench, during simulation, can generate a set of test stimuli capable of being utilized to functionally verify the circuit design 311, for example, by providing test scenarios to determine whether the circuit design 311 can function as expected. In some embodiments, the design tool 301 (or another tool in the validation design environment 300) can receive the test bench from a source external to the design tool 301, such as a user interface of the computing device 101, another tool implemented by the computing device 101, or the design tool 301 may internally generate the test bench. The design tool 301 can generate waveform data, which can correspond to a simulated output created by the circuit design 311 during simulation with the test bench. The design tool 301 (or another tool in the validation design environment 300) can perform functional verification for the circuit design 311, for example, by comparing the waveform data with an expected output from the circuit design 311 in response to test stimuli generated by the test bench during simulation.

The circuit design unit 310 can include a validation unit 312 to incorporate a validation system into the circuit design 311. The validation system, as described in the circuit design 311, can be configured to monitor operation of the electronic device and selectively output monitored data for debugging operations. The design tool 301 can output the circuit design 311 embedded with the validation system for further transformation on a design flow towards implementation in a programmable logic device.

The validation unit 312 can include a monitoring unit 313 to configure the validation system in the circuit design 311, for example, by defining which signal(s) the validation system receives and what operations the validation system performs based on the received signal(s). In some embodiments, the monitoring unit 313 can configure the validation system to receive one or more trace signals, for example, from a portion of the electronic device described in the circuit design 311, and record the trace signals in a buffer or other memory device. The monitoring unit 313 can configure the validation system to receive one or more trigger signals, for example, from a portion of the electronic device described in the circuit design 311. The trace signals and the trigger signals can include packetized communication, binary data, power signaling, clock signaling, or any other signal generated, received, transmitted, or exchanged by the electronic device.

The monitoring unit 313 also can configure the validation system to implement debug logic, for example, which can perform pattern detection or meta-stability glitch detection on the trigger signals. For example, the debug logic can review the received trigger signals to determine whether the trigger signals include a specific signature or embedded bit stream, whether the trigger signals are set in a particular state, whether the trigger signals have transitioned between a particular set of states in a preset order or with a preset timing, or any other discernable trigger signal pattern. The monitoring unit 313 can configure the validation system to forward at least a portion of the recorded trace signals for debugging operations in response to detecting of a pattern, a meta-stability glitch, or another trigger event by the debug logic. The monitoring unit 313 also can define additional interconnections for the validation system, such as interconnections to input/output ports of the programmable logic device, interconnections between different internal components of the validation system, or the like. Embodiments of validation system configuration will be described below in greater detail.

The validation design environment 300 can include a synthesis tool 320 to receive the circuit design 311 from the design tool 301 and synthesize the circuit design 311 from the register transfer level representation into a gate-level representation, such as into a netlist 321. In some embodiments, the synthesis tool 320 can perform a generic synthesis—generating generic gates corresponding to the functionality described in the circuit design 311—and then perform a physical synthesis that maps the generic gates to a target programmable logic device. In some embodiments, the synthesis tool 320 (or a tool external to the synthesis tool 320) can functionality verify the netlist 321, for example, by simulating the netlist 321 with various test scenarios and verifying that the results of the simulation corresponds with an expected output from the netlist 321 in response to test stimuli generated during simulation.

The validation design environment 300 can include a place and route tool 330 to determine placement of elements from the netlist 321 in the programmable logic device and the interconnections between those elements. The place and route tool 330 can generate a configuration file 331 that, when downloaded to the programmable logic device, can cause the programmable logic device to implement the functionality described in the circuit design 311. The programmable logic device can include a field programmable gate array (FPGA) architecture, an application specific integrated circuit (ASIC) architecture, a system-on-a-chip (SOC) architecture, or the like.

The programmable logic device, as programmed with the configuration file 331, can include both the electronic system and the validation system. As discussed above, the validation system can be configured to monitor operation of the electronic device in the programmable logic device and selectively output monitored data for debugging operations. For example, the validation system can receive trace signal(s) and trigger signal(s) from the electronic device, utilize debug logic to determine whether the trigger signals correspond to a trigger event, and output debug data from the programmable logic device in response to the trigger event.

Since, in some embodiments, the validation system can utilize one or more general input/output pins of the programmable logic device to output the debug data, which can be routed back to the validation unit 312 of the design tool 301, the validation unit 312 can include a debug unit 314 to perform the debugging operations based on the debug data routed from the programmable logic device. For example, the debug unit 314 can prompt presentation of the debug data along with information corresponding to the trigger event that prompted the validation system to output the debug data. In some embodiments, the debug logic in the validation system can be dynamically programmable, for example, after the programmable logic device has been configured with the circuit design 311. The debug unit 314 can generate a trigger configuration, which can include a configuration for the debug logic of the validation system, and provide the trigger configuration to the validation system configured in the programmable logic device. The trigger configuration can program (or re-program) the debug logic on-the-fly during debug operations. Embodiments of the dynamic trigger configuration will be described below in greater detail.

Debug and Validation Environment

Figure 4:
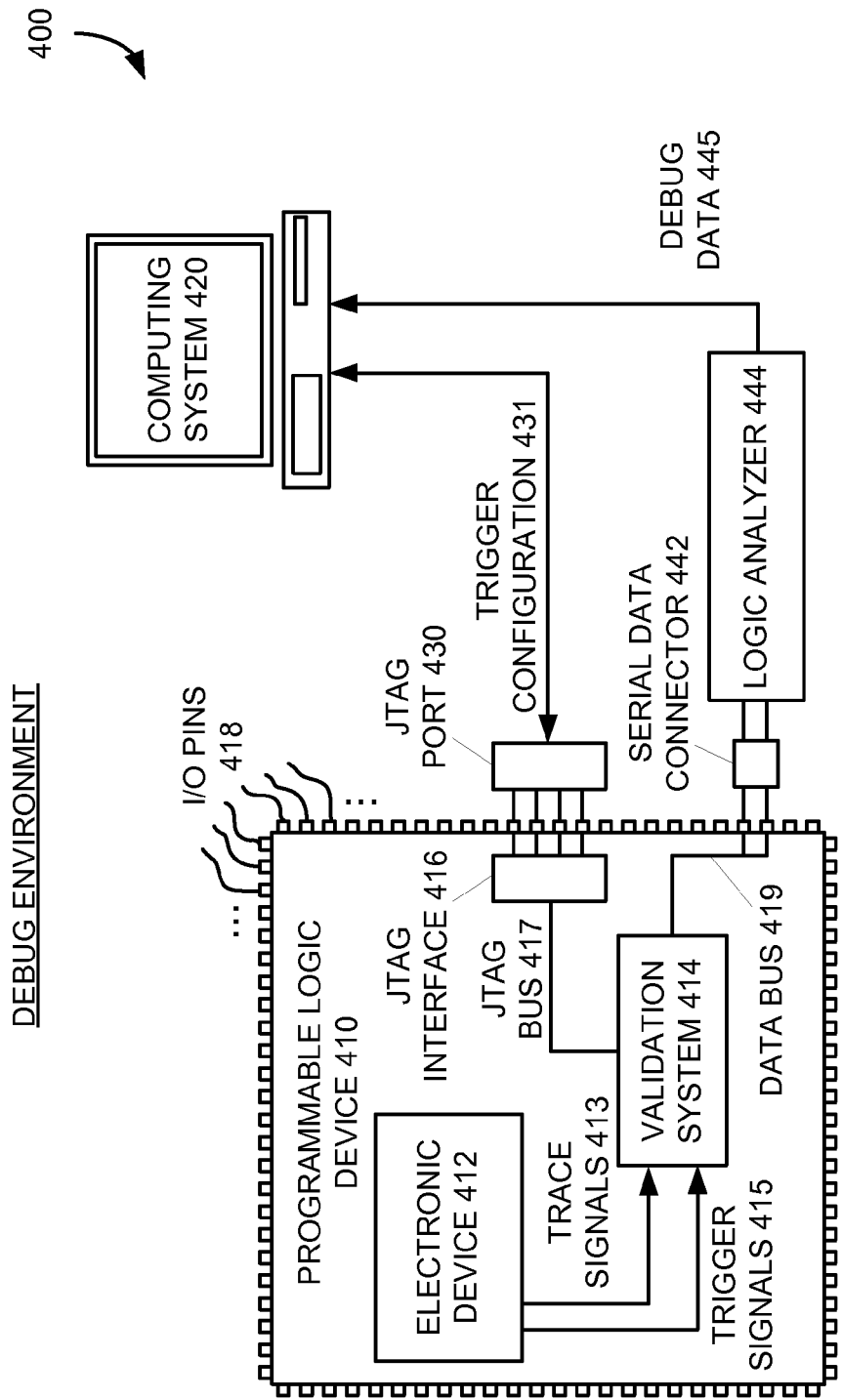
FIG. 4 illustrates an example debug and validation environment including a programmable logic device configured with a validation system according to various examples of the invention.

FIG. 4 illustrates an example debug and validation environment 400 including a programmable logic device 410 configured with a validation system 414 according to various examples of the invention. Referring to FIG. 4, the programmable logic device 410 can be configured to include an electronic device 412 and the validation system 414, which can be configured to receive various signals from the electronic device 412, such as trace signals 413 and trigger signals 415. The programmable logic device 410 can include a field programmable gate array (FPGA) architecture, an application specific integrated circuit (ASIC) architecture, a system-on-a-chip (SOC) architecture, or the like.

The validation system 414 can include debug logic (not shown) to analyze the trigger signals 415, for example, to identify occurrences of one or more trigger events. In some embodiments, the trigger events can correspond to a pattern or meta-stable glitch detected in the trigger signals 415. In response to identifying an occurrence of a trigger event, the validation system 414 can output at least a portion of the trace signals 413, for example, via a set of one or more input/output (I/O) pins 418. In some embodiments, the validation system 414 can packetize at least a portion of the trace signals 413, optionally including a timestamp, and place the trace signal packets on a data bus 419 to output through the set of I/O pins 418.

The debug environment 400 can include a computing system 420 to implement a tool having debug functionality, which can receive and analyze the trace signal packets output from the validation system 414. The debug environment 400 can include a serial data connector 442 to couple to the set of the I/O pins 418 of the programmable logic device 410 and include a logic analyzer 444 to extract data corresponding to the trace signals 413 output by the validation system 414 via the I/O pins 418. The logic analyzer 444 can forward the extracted data as debug data 445 to the computing system 420 for debugging operations. The computing system 420 can present the debug data 445 for review and allow alteration of the circuit design utilized in the design flow that configured the programmable logic device 410. When the circuit design is altered, the computing system 420 can iterate through the design flow, i.e., re-synthesize the altered circuit design, re-perform the place-and-route process, and then re-configure the programmable logic device 410 with the new configuration file.

The computing system 420 also can dynamically configure (and reconfigure) portions of the programmable logic device 410 without having to iterate through the design flow, i.e., not having to re-perform synthesis and place-and-route operations in order to alter the configuration of the programmable logic device 410. In some embodiments, the validation system 414 in the programmable logic device 410 can include reconfigurable debug logic, for example, which can implement programmable trigger signal analysis in response to a trigger configuration 431 from the computing system 420.

In some embodiments, the validation system 414 can receive the trigger configuration 431 from the computing system 420, for example, via a Joint Test Action Group (JTAG) bus 417 and a JTAG interface 416 configured in the programmable logic device 410. For example, the computing system 420 can send the trigger configuration 431 to the programmable logic device 410 via a JTAG port 430, and the programmable logic device 410 can forward the trigger configuration 431 to the validation system 414 via the JTAG interface 416 and the JTAG bus 417. This re-configuration of the programmable logic device 410 can allow the validation system 414 to be dynamically reconfigurable while the programmable logic device 410 performs operations at run-time.

Figure 5:
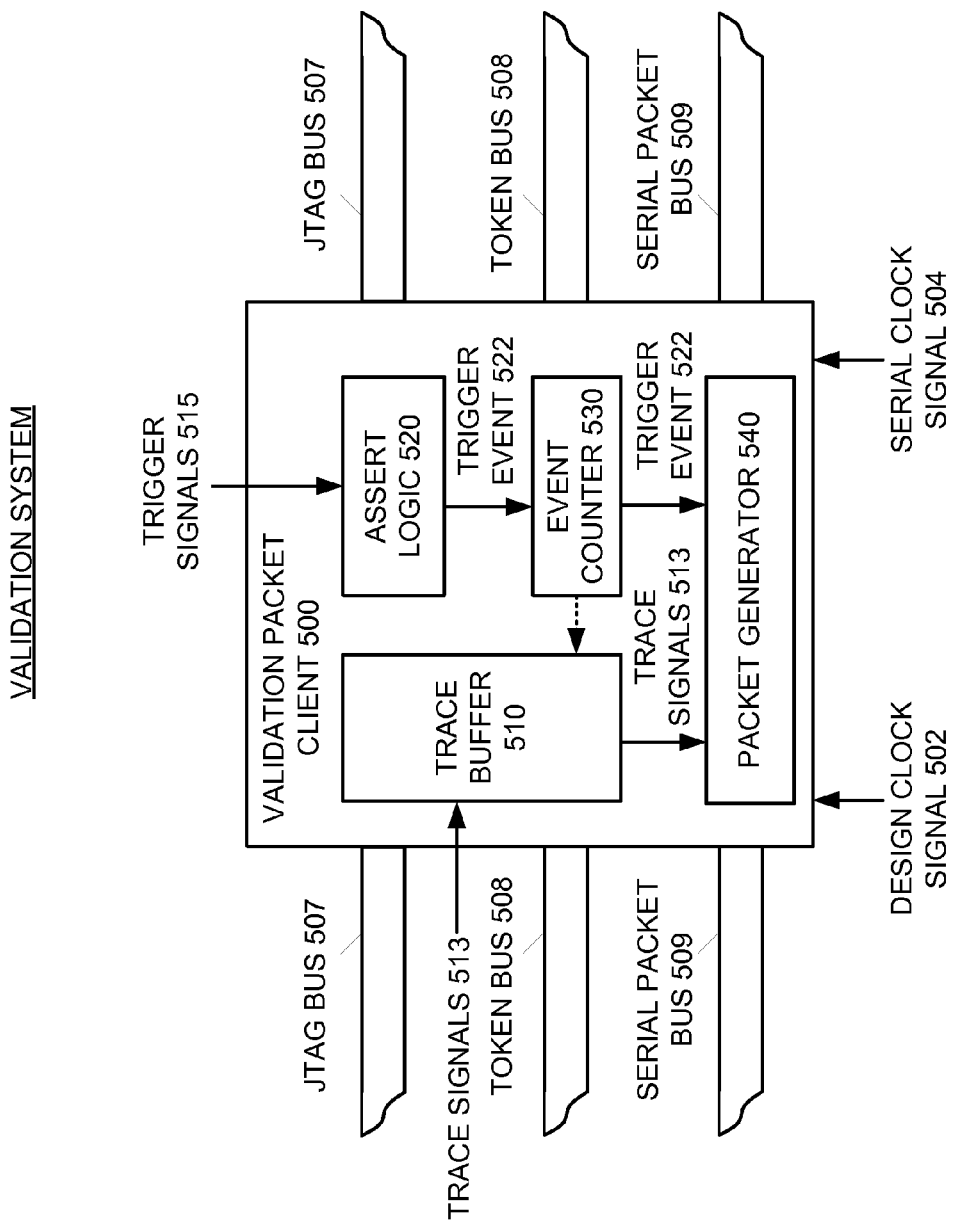
FIG. 5 illustrates an example implementation of a validation system according to various embodiments of the invention.

FIG. 5 illustrates an example implementation of a validation system according to various embodiments of the invention. Referring to FIG. 5, the validation system can include a validation packet client 500 to detect occurrences of trigger events 522 from trigger signals 515 received from an electronic device, and, in response to the trigger events 522, output packet signals that include data from trace signals 513 received from the electronic device. The validation packet client 500 can receive a design clock signal 502, for example, corresponding to the speed at which the electronic device in the programmable logic device operates, which can allow the validation packet client 500 to operate at-speed of the electronic device, i.e., receive and process stimulus, such as trace signals 513 and trigger signals 515, in real-time.

The validation packet client 500 can include a trace buffer 510 to record one or more trace signals 513 received from the electronic device. The trace signals 513 can include packetized communication, binary data, power signaling, clock signaling, or any other signal generated, received, transmitted, or exchanged by the electronic device. In some embodiments, the trace buffer 510 can implement a First-In-First-Out (FIFO) buffer, which can be configured to delete or overwrite recorded trace signals 513 when the trace buffer 510 is full and new trace signals 513 are received by the validation packet client 500.

The validation packet client 500 can include assert logic 520 to analyze one or more trigger signals 515 received from the electronic device. The trigger signals 515 can include packetized communication, binary data, power signaling, clock signaling, or any other signal generated, received, transmitted, or exchanged by the electronic device. The assert logic 520 can be configured to identify trigger events 522 in response to the trigger signals 515, and annunciate a detection of the trigger event 522 to other portions of the validation packet client 500, such as an event counter 530. In some embodiments, the assert logic 520 can review the received trigger signals 515 to determine whether the trigger signals 515 include a specific signature or bit-pattern, whether the trigger signals 515 enter a particular state, whether the trigger signals 515 have transitioned between a particular set of states in a preset order or with a preset timing, or any other discernable trigger signal pattern.

In some embodiments, the assert logic 520 can be configured (or dynamically re-configured) by trigger configuration, for example, receive from a Joint Test Action Group (JTAG) bus 507. The trigger configuration can prompt a configuration or re-configuration of the assert logic 520, which can redefine what constitutes an occurrence of a trigger event 522 in response to the trigger signals 515. The validation packet client 500, in some embodiments, can couple to the JTAG bus 507 in a serial-pipelined-fashion, for example, the validation packet client 500 can receive information from one section of the JTAG bus 507, analyze the information to determine whether it is destined for the validation packet client 500, and selectively forward the information to another section of the JTAG bus 507 based on the analysis.

The validation packet client 500 can include a packet generator 540 to generate packet signals from the trace signals 513 stored in the trace buffer 510, for example, in response to the assert logic 520 detecting a trigger event 522. In some embodiments, the event counter 530 can annunciate a detection of the trigger event 522 to the packet generator 540, which can prompt the packet generator 540 to initiate generation of the packet signals with the trace signals 513 stored in the trace buffer 510. The event counter 530 also can annunciate detection of the trigger event 522 to the trace buffer 510, which can prompt the trace buffer 510 to capture or preserve a set of one or more trace signals 513 for use by the packet generator 540. In some embodiments, the annunciation of the trigger event 522 can preserve one or more of the trace signals 513 currently recorded in the trace buffer 510, possibly having the trace buffer 510 ceasing to record newly received trace signals 513.

The validation packet client 500 can output the packet signals on a serial packet bus 509 based, at least in part, on a serial clock signal 504 received by the validation packet client 500. The validation packet client 500, in some embodiments, can couple to the serial packet bus 509 in a serial-pipelined-fashion, for example, the validation packet client 500 can pass received data between different sections of the serial packet bus 509 and selectively insert the generated packet signals onto the serial packet bus 509. In some embodiments, when the serial packet bus 509 is a shared resource, the validation packet client 500 can access the serial packet bus 509 based on an arbitration scheme. For example, access to the serial packet bus 509 can be token-based, i.e., when the validation packet client 500 can insert packet signals on the serial data bus 509 when in possession of a token. In some embodiments, the token can be passed between devices capable of controlling the serial access bus 509 via a dedicated token 508 bus or even through the serial packet bus 509 itself. The validation packet client 500, in some embodiments, can couple to the token bus 508 in a serial-pipelined-fashion, for example, the validation packet client 500 can receive a token from the token bus 508, hold it while utilizing the serial packet bus 509, and then send the token out on the token bus 508.

Figure 6:
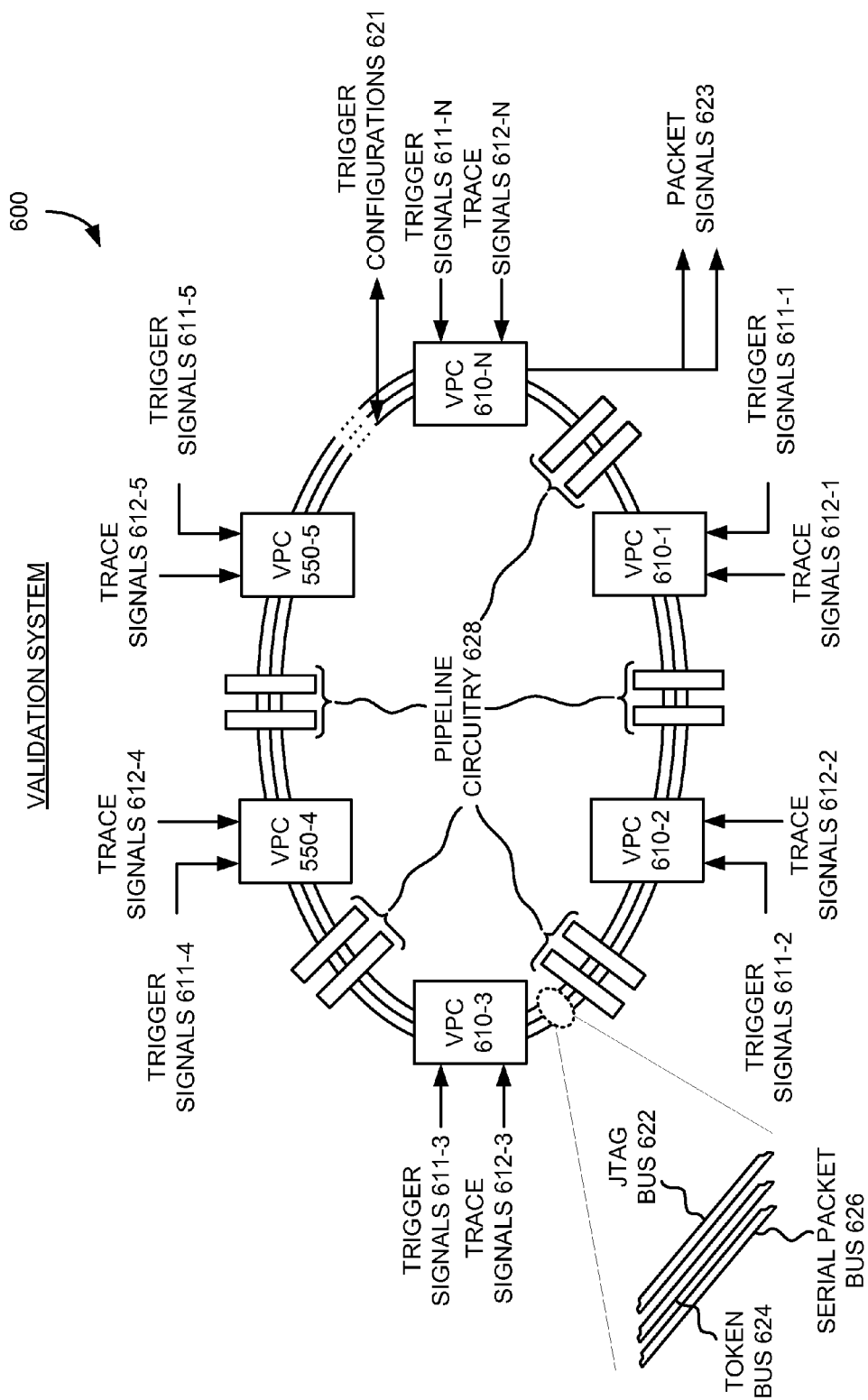
FIG. 6 illustrates another example implementation of a validation system according to various examples of the invention.

FIG. 6 illustrates another example implementation of a validation system 600 according to various examples of the invention. Referring to FIG. 6, the validation system 600 can include multiple validation packet clients 610-1 to 610-N configured in a serial-pipelined-fashion, each having access to a JTAG bus 622, a token bus 624, and a serial packet bus 626. Each validation packet clients 610-1 to 610-N can be configured similarly to the validation packet client 500 described above in FIG. 5 except that each of them can be configured to receive different or various trigger signals 611-1 to 611-N, respectively, receive different or various trace signals 612-1 to 612-N, respectively, and include different or various assert logic programming. In other words, each of the validation packet clients 610-1 to 610-N can selectively forward different trace signals 612-1 to 612-N as packet signals 623 for debugging operations in response to different trigger events.

The validation system 600 can include pipeline circuitry 628 interleaved between the validation packet clients 610-1 to 610-N, which can allow the flow of trigger configurations 621 and tokens to traverse to any of the validation packet clients 610-1 to 610-N, while also allowing packet signals 623 from each of the validation packet clients 610-1 to 610-N to be output from the validation system 600, for example, via validation packet client 610-N.

Figure 7:
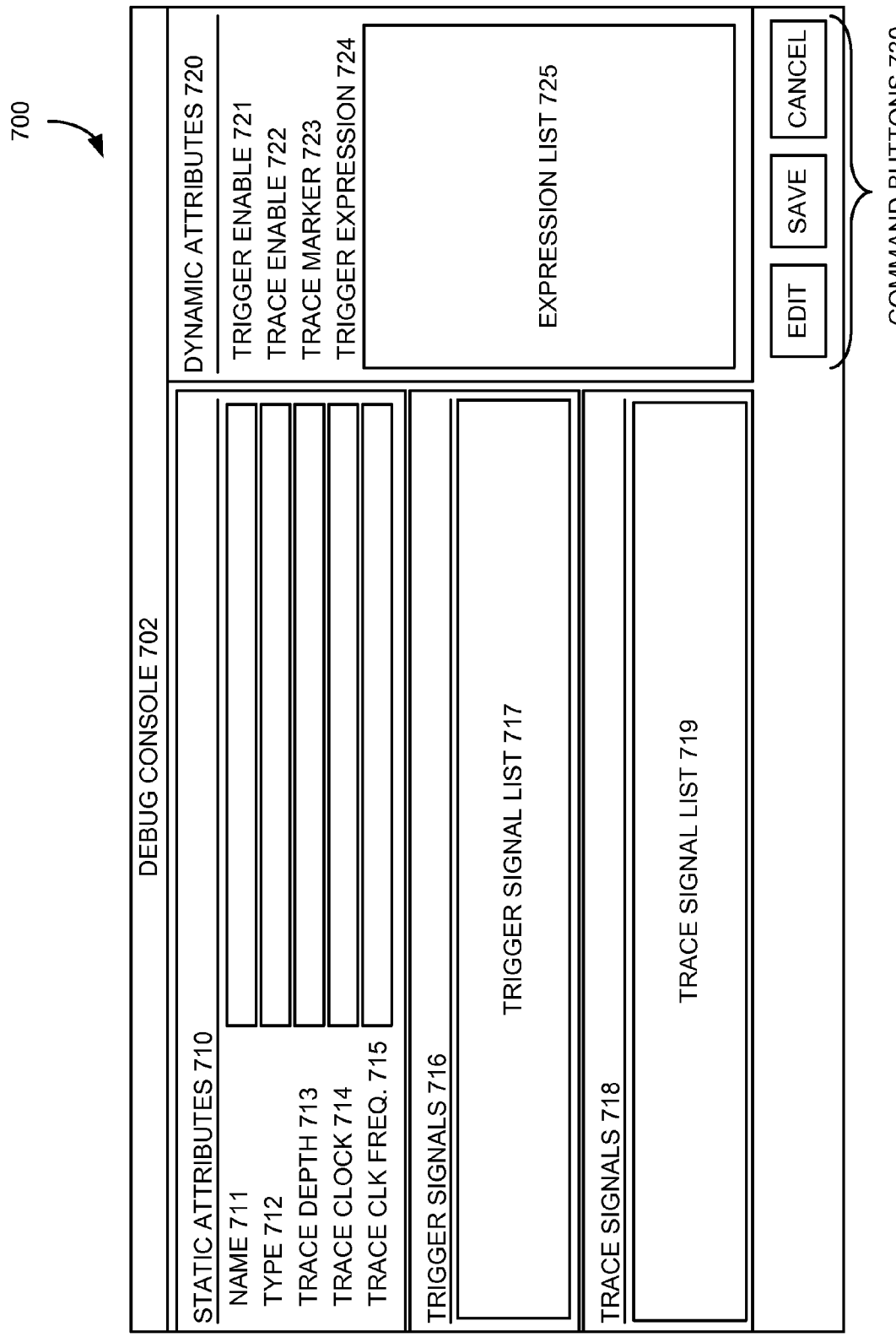
FIG. 7 illustrates an example implementation display window for configuring an example validation system according to various embodiments of the invention.

FIG. 7 illustrates an example implementation display window 700 for configuring an example validation system according to various embodiments of the invention. Referring to FIG. 7, the display window 700 can include a display console 702, which can include user-definable attributes of a validation system. For example, the display console 702 can include a static attributes section 710 including fields that can define static attributes of the validation system, and include a dynamic attributes section 720 including fields that can define dynamically-adjustable attributes of the validation system. The debug console 702 can include a set of command buttons 730, which can allow a user to edit a current attribute set for a validation packet client, and save or cancel any alterations to the current attribute set for the validation packet client.

The static attributes 710 can correspond to those portions of the validation system configuration that can be altered by an iteration of the "design flow"—altering circuit design with new attribute, performing verification, performing synthesis, performing another verification, performing place-and-route, and configuring a programmable logic device with the circuit design. The dynamic attributes 720 can be alter via an iteration of the "design flow" as well as by issuing a new configuration file or command to an already configured programmable logic device, for example, via a JTAG port of the already configured programmable logic device.

The static attributes 710 can include a name field 711 to define which validation packet client in the validation system the static and dynamic attributes panes 710 and 720 currently reference. The static attributes 710 can include a type field 712 to define which type trigger event detection the corresponding validation packet client is to perform. For example the type field 712 can be populated to define a pattern matching detection type, a meta-stability glitch detection type, or the like. The static attributes 710 can include a trace depth field 713 to define a size of a trace buffer in the corresponding validation packet client. The static attributes 710 can include a trace clock field 714 to define a clock signal for the corresponding validation packet client to receive, such as a design clock signal. The static attributes 710 can include a trace clock frequency filed 715 to define a frequency of the clock signal defined in the trace clock field 714. The static attributes 710 can include a trigger signals field 716 to define which trigger signals for the corresponding validation packet client to receive, which can be included in a trigger signal list 717. The static attributes 710 can include a trace signals field 718 which trace signals for the corresponding validation packet client to receive, which can be included in a trace signal list 719.

The dynamic attributes 720 can include a trigger enable field 721 to define whether the corresponding validation packet client enables analysis of received trigger signals. The dynamic attributes 720 can include a trace enable field 722 to define whether the corresponding validation packet client enables recordation of received trace signals. The dynamic attributes 720 can include a trace marker field 723 to define a marker for the trace signals received by the corresponding validation packet client. The dynamic attributes 720 can include a trigger expression field 724 to define trigger expressions or conditions that, if met by one or more of the trigger signals, can elicit a trigger event. The trigger expressions can be populated into an expression list 725.

Figure 8:
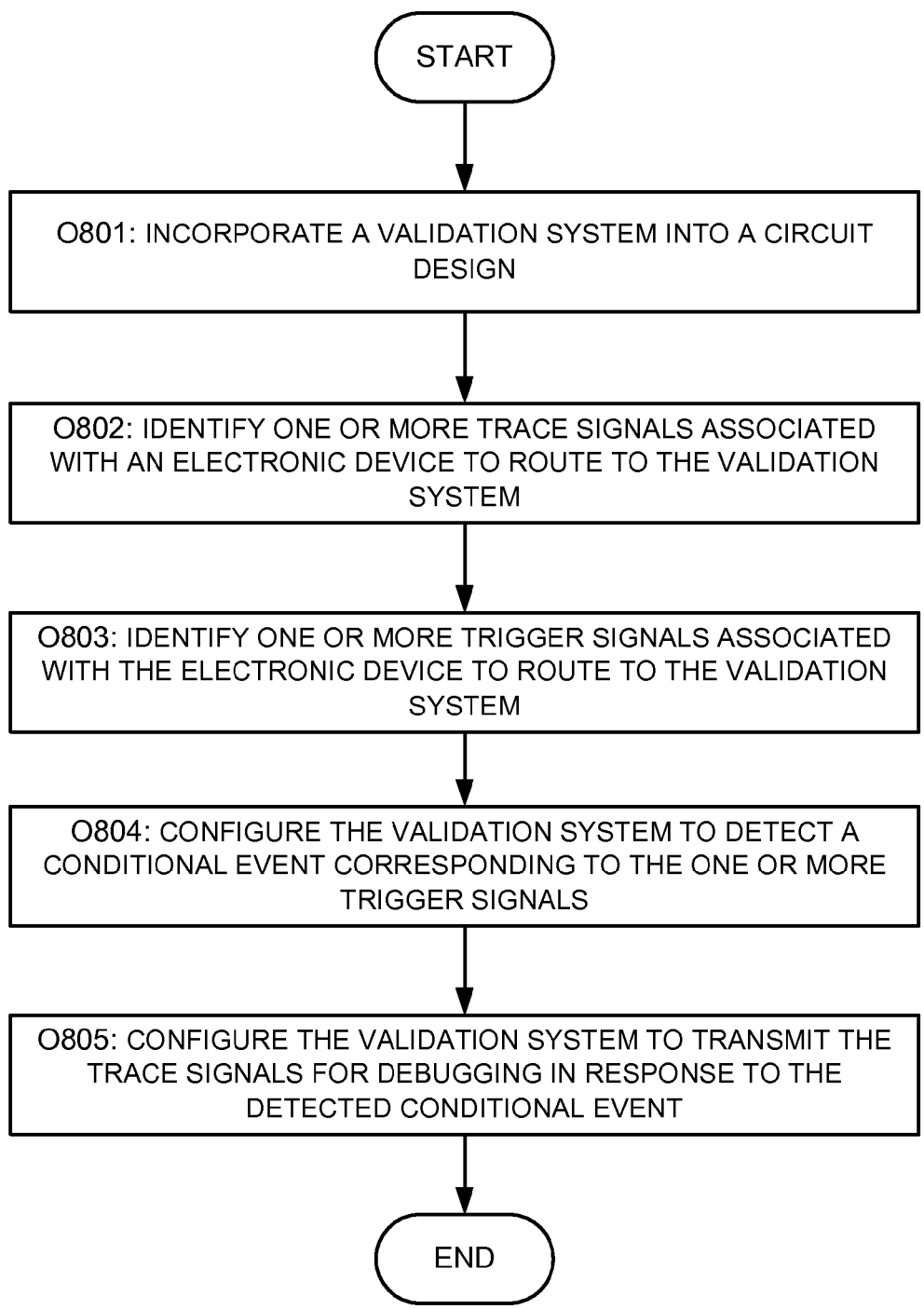
FIG. 8 illustrates an example flowchart for incorporating and configuring a validation system in a circuit design according to various embodiments of the invention.

FIG. 8 illustrates an example flowchart for incorporating and configuring a validation system in a circuit design according to various embodiments of the invention. Referring to FIG. 8, in a block 801, a design tool can incorporate a validation system into a circuit design. The validation system can have various different configurations, for example, comprising a single validation packet client or have a ring of multiple validation packet client coupled in a serial pipeline fashion, or the like.

In a block 802, the design tool can identify one or more trace signals associated with an electronic device to route to the validation system. The trace signals can correspond to operational signals from the electronic device that the validation system can record. The trace signals can include packetized communication, binary data, power signaling, clock signaling, or any other signal generated, received, transmitted, or exchanged by the electronic device.

In a block 803, the design tool can identify one or more trigger signals associated with the electronic device to route to the validation system. The trace signals can correspond to operational signals from the electronic device that the validation system, which can include packetized communication, binary data, power signaling, clock signaling, or any other signal generated, received, transmitted, or exchanged by the electronic device.

In a block 804, the design tool can configure the validation system to detect a conditional event corresponding to the one or more trigger signals. For example, the validation system can include assertion logic to review the received trigger signals and determine whether the trigger signals include a specific signature or embedded bit stream, whether the trigger signals are set in a particular state, whether the trigger signals have transitioned between a particular set of states in a preset order or with a preset timing, or any other discernable trigger signal pattern. In some embodiments, the design tool can configure the validation system after the circuit design has been configured into a programmable logic device, for example, by providing an assertion configuration capable of configuring the assertion logic to the validation system.

In a block 805, the design tool can configure the validation system to transmit the trace signals for debugging in response to the detected conditional event. The design tool can identify semantics, syntax, and format of messages including the trace signals to be transmitted for debugging. The design tool also can identify timing of when the messages can be transmitted for debugging, for example, when the validation system transmits the messages over a shared resource, such as a serial packet bus.

Meta-Stability Glitch Detection

Figure 9:
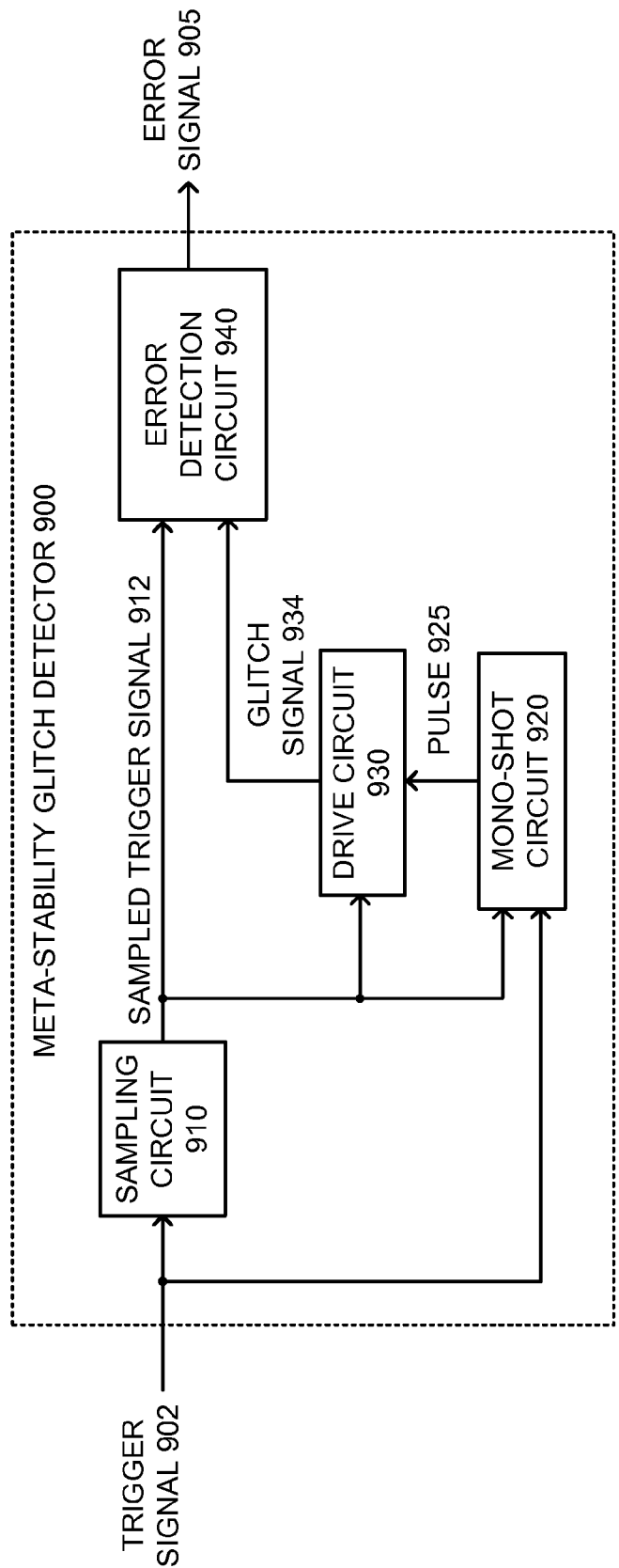
FIG. 9 illustrates an example meta-stability glitch detector, which may be implemented by assert logic in a validation system according to various embodiments of the invention.

FIG. 9 illustrates an example meta-stability glitch detector 900, which may be implemented by assert logic in a validation system according to various embodiments of the invention. Referring to FIG. 9, the meta-stability glitch detector 900 can receive a trigger signal 902, for example, from an electronic device implemented in a programmable logic device, and monitor the trigger signal 902 for meta-stability. Signal meta-stability occurs when a signal or output fails to resolve or settle to a binary value, such as a '0' or '1', within a predetermined time. For example, some latching devices, such as D-Flip-Flop, can output signals that remain meta-stable after a clock-to-output time when they latch data that has not fully set-up, i.e., data that arrives too late to meet a set-up time requirement for the latching device. The signal can remain in the meta-stable state for an unbounded period of time and before it settles, sometimes unpredictably, to one of the binary values. This delay in settling to a binary value can cause various signal glitches, which can cause incorrect performance of operations by the electronic device.

The meta-stability glitch detector 900 can generate an error signal 905 to annunciate whether the trigger signal 902 remained meta-stable after it should have resolved to a binary value, which could possibly cause a meta-stable glitch for the electronic device. In some embodiments, the validation system can monitor one or more trace signals of the electronic device and selectively output the trace signals for debugging operations when the error signal 905 indicates a presence of a meta-stable glitch in the trigger signal 902.

The meta-stability glitch detector 900 can include a sampling circuit 910 to receive the trigger signal 902 and to latch or sample the trigger signal 902. In some embodiments, when the electronic device outputs the trigger signal 902 to the meta-stability glitch detector 900 on a rising clock edge, the sampling circuit 910 can sample or latch the trigger signal 902 on a preceding falling clock edge. Once latched, the sampling circuit 910 can output a sampled trigger signal 912 to other components of the meta-stability glitch detector 900.

The meta-stability glitch detector 900 can include a mono-shot circuit 920 to compare the trigger signal 902 and the sampled trigger signal 912, and to generate a pulse 925 when the trigger signal 902 and the sampled trigger signal 912 differ in value. Thus, when the trigger signal 902 is meta-stable and resolves or changes a value after the sampling circuit 910 sampled the trigger signal 902, the mono-shot circuit 920 can detect the change and equate it to the meta-stability of the trigger signal 902.

The meta-stability glitch detector 900 can include a drive circuit 930 to receive the sampled trigger signal 912 from the sampling circuit 910 and generate a glitch signal 934 based on the sampled trigger signal 912. In some embodiments, the drive circuit 930 can invert the sampled trigger signal 912. The drive circuit 930 can selectively output the glitch signal 934 in response to the pulse 925 from the mono-shot circuit 920.

The meta-stability glitch detector 900 can include an error detection circuit 940 to compare the sampled trigger signal 912 and the glitch signal 934, and to generate the error signal 905 when the sampled trigger signal 912 and the glitch signal 934 differ in value. Since the glitch signal 934 can be the inversion of the sampled trigger signal 912, for example, when the mono-shot circuit 920 detects meta-stability in the trigger signal 902 and generated the pulse 925, the error detection circuit 940 can output the error signal 905 that annunciates a presence of meta-stability in the trigger signal 902 after a time period that it should have resolved to a binary value.

Since the meta-stability glitch detector 900 can receive a new trigger signal after each clock cycle, the meta-stability glitch detector 900 also can include reset functionality that can reset the components of the meta-stability glitch detector 900, for example, after the error detection circuit 940 outputs an error signal 905 indicating a presence of meta-stability. Embodiments of the reset functionality will be described below in greater detail.

Figure 10:
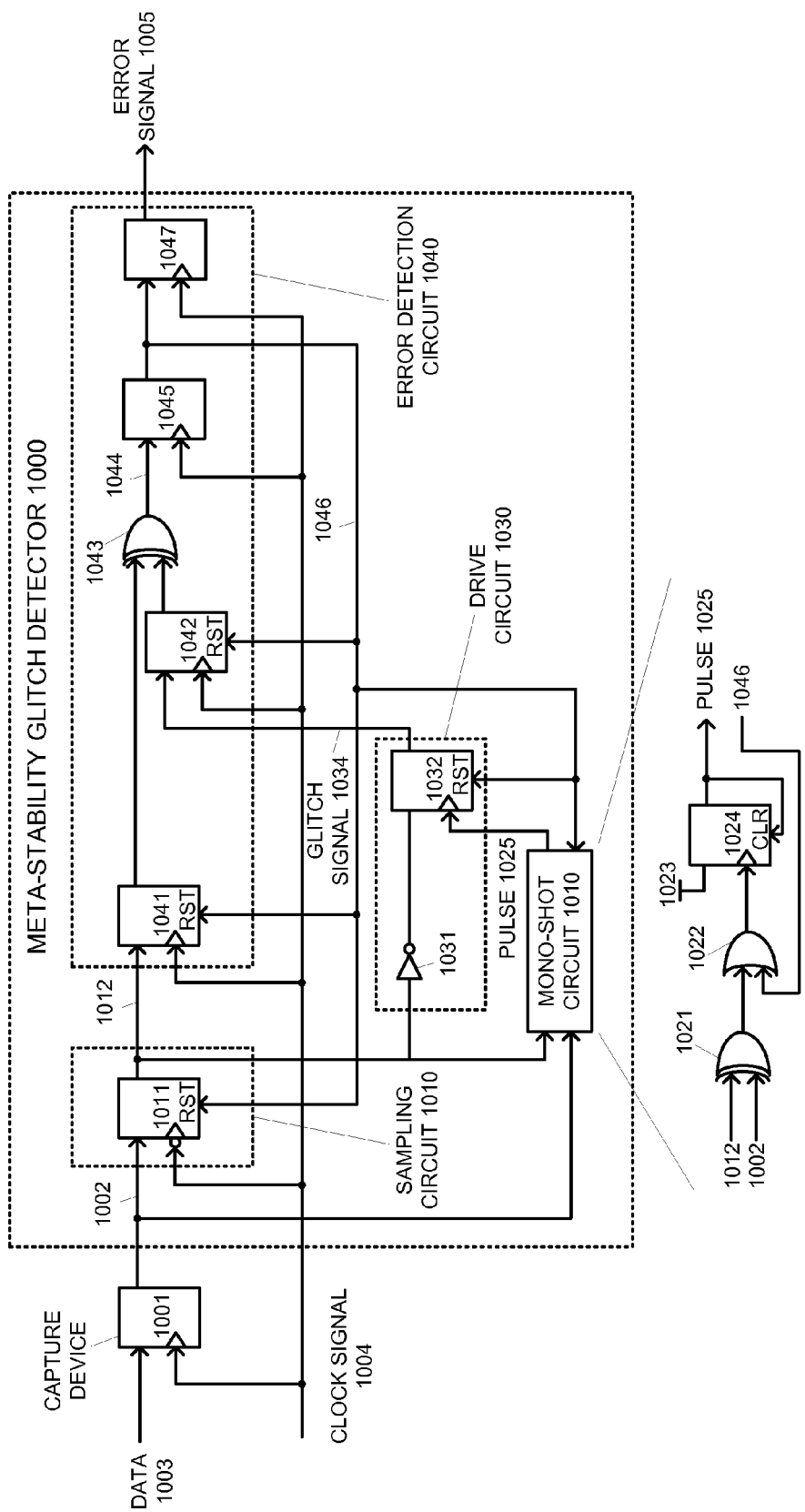
FIG. 10 illustrates another example meta-stability glitch detector according to various embodiments of the invention.

FIG. 10 illustrates another example meta-stability glitch detector 1000 according to various embodiments of the invention. Referring to FIG. 10, the meta-stability glitch detector 1000 can receive an output 1002 from a capture device 1001, for example, located in electronic device implemented by a programmable logic device, and monitor the output 1002 for meta-stability. The capture device 1001 can latch data 1003 in response to a clock signal 1004 and provide the latched data 1003 to the meta-stability glitch detector 1000 as the output 1002. When the capture device 1001 latches data 1003 that has not settled, i.e., arrived too late to satisfy a set-up time requirement of the capture device 1001, the output 1002 of the capture device 1001 can become meta-stable for an unbounded time period, which can introduce glitches into the electronic device. The meta-stability glitch detector 1000 can detect if the output 1002 is meta-stable during a time period that can introduce glitches into the electronic device, and generate an error signal 1005 to annunciate a possibility of a glitch occurring in the electronic device due to the meta-stability of the output 1002.

The meta-stability glitch detector 1000 can include a sampling circuit 1010 to receive the output 1002 from the capture device 1001 and latch or sample the output 1002. In some embodiments, when the capture device 1001 provides the output 1002 to the meta-stability glitch detector 1000 on a rising edge of the clock signal 1004, the sampling circuit 1010 can sample or latch the output 1002 on a preceding falling edge of the clock signal 1004. The sampling circuit 1010, in some embodiments, can include a latch 1011 or other storage element to capture the output 1002 in response to the clock signal 1004. Once latched, the sampling circuit 1010 can output a sampled output 1012 to other components of the meta-stability glitch detector 1000.

The meta-stability glitch detector 1000 can include a mono-shot circuit 1020 to compare the output 1002 from the capture device 1001 with the sampled output 1012 from the sampling circuit 1010, and generate a pulse 1025 when the output 1002 and the sampled output 1012 differ in value. Thus, when the output 1002 is meta-stable and resolves or changes value after the sampling circuit 1010 sampled the output 1002, the mono-shot circuit 1020 can detect the value change in the output 1002 and equate that value change to the meta-stability of the output 1002.

The mono-shot circuit 1020 can include logic circuitry, such as an XOR logic device 1021 and an OR logic gate 1022. The XOR logic device 1021 can compare the output 1002 from the capture device 1001 with the sampled output 1012 from the sampling circuit 1010, and output a logic value "1" when the output 1002 and the sampled output 1012 differ in value. The OR logic gate 1022 can receive the output of the XOR logic device 1021 and a reset signal 1046, and output a logic value "1" when the output of the XOR logic device 1021 corresponds to a logic value "1" or when the reset signal 1046 has been asserted.

The mono-shot circuit 1020 can include a latch 1024 or other storage element to capture a signal 1023, for example, corresponding to a logic level "1", in response to the output of the logic circuitry of the mono-shot circuit 1020, and output the captured signal 1023 as the pulse 1025. The pulse 1025 can correspond to short burst of a high logic level, which returns back to a low logic level due to a feedback in the mono-shot circuit 1020. For example, the pulse 1025 can be fed back to the latch 1024, which can prompt the latch 1024 to clear its stored value, i.e., the captured signal 1023, or set it to a logic level "0" when the pulse 1025 has a logic level "1". In other words, the pulse 1025 can remain at a high level for a period of time corresponding to both a propagation of the pulse 1025 to the latch 1024 through the feedback and a delay associated with performance of the clear operation by the latch 1024 in response to the pulse 105.

The meta-stability glitch detector 1000 can include a drive circuit 1030 to receive the sampled output 1012 from the sampling circuit 1010 and generate a glitch signal 1034 based on the sampled output 1012. In some embodiments, the drive circuit 1030 can include logic circuitry, such as an inverter 1031, to invert the sampled output 1012. The drive circuit 1030 can selectively output the glitch signal 1034 in response to the pulse 1025 from the mono-shot circuit 1020. In some embodiments, the drive circuit 1030 can include a latch 1032 or other storage element to capture the inversion of the sampled output 1012 from the inverter 1031 in response to the pulse 1025, and to output the inversion of the sampled output 1012 as the glitch signal 1034.

The meta-stability glitch detector 1000 can include an error detection circuit 1040 to compare the sampled output 1012 with the glitch signal 1034, and to generate the error signal 1005 when the sampled output 1012 and the glitch signal 1034 differ in value. Since the glitch signal 1034 can be the inversion of the sampled output 1012, for example, when the mono-shot circuit 1020 detects meta-stability in the output 1002, the error detection circuit 1040 can output the error signal 1005 that annunciates a presence of meta-stability in the output 1002 after a time period that it should have been resolved.

The error detection circuit 1040 can include latches 1041 and 1042 to capture the sampled output 1012 from the sampling circuit 1010 and the glitch signal 1034 from the drive circuit 1030, respectively, in response to the clock signal 1004. The latches 1041 and 1042 can provide the captured sampled output 1012 and glitch signal 1034, respectively, to logic circuitry 1043, such as an XOR logic device, which can compare the captured sampled output 1012 with glitch signal 1034. The logic circuitry 1043 can generate an output 1044 that corresponds to a presence of meta-stability in the output 1002 after a time period that it should have resolved. In some embodiments, a value of the output 1044 from the logic circuitry 1043 can correspond to a value of the error detection signal 1005.

The error detection circuit 1040 can include a reset latch 1045 to capture the output 1044 from the logic circuitry 1043 in response to the clock signal 1004, and output a reset signal 1046. The reset signal 1046 can have a value corresponding to a value of the output 1044 from the logic circuitry 1043. The meta-stability glitch detector 1000 can route the reset signal 1046 to the sampling circuit 1010, the mono-shot circuit 1020, the drive circuit 1030, and other portions of the error detection circuit 1040. The sampling circuit 1010, the mono-shot circuit 1020, the drive circuit 1030, and other portions of the error detection circuit 1040 can perform various reset operations in response to the reset signal 1046. For example, the latches 1011, 1032, 1041, and 1042 can all reset in response to receiving the reset signal 1046.

The error detection circuit 1040 can include an output latch 1047 to capture the reset signal 1046 from the reset latch 1045 in response to the clock signal 1004, and output the reset signal 1046 as the error signal 1005. In other words, when a value of the output 1044 from the logic circuitry 1043 identifies a presence of meta-stability in the output 1002, the output 1044 can be utilized by the reset latch 1045 to reset the meta-stability glitch detector 1000 and subsequently by the output latch 1047 to output the error signal 1005. The error signal 1005 can annunciate a presence of meta-stability in the output 1002 after a time period that it should have been resolved.

Figure 11:
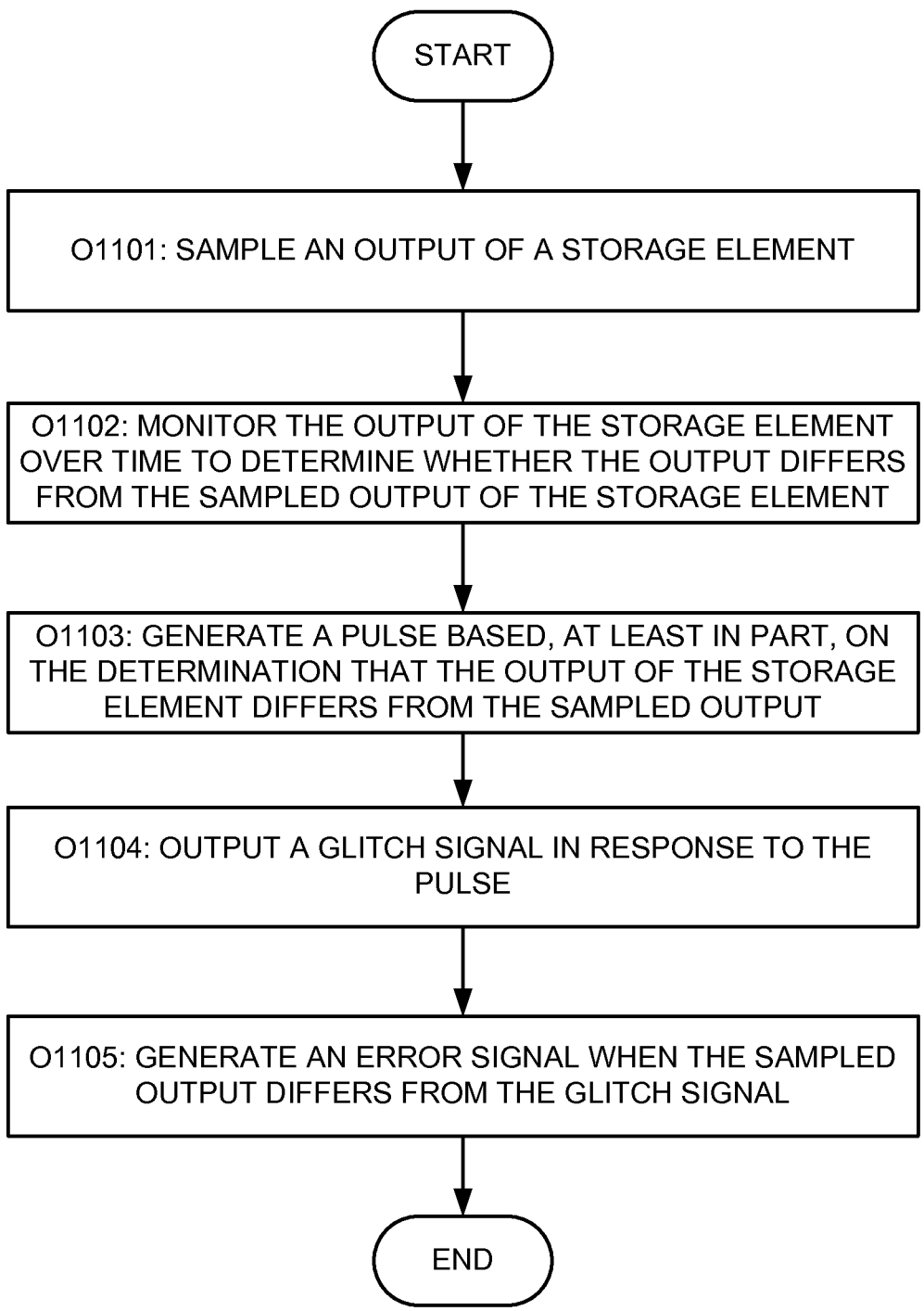
FIG. 11 illustrates an example flowchart for operation of a meta-stability glitch detector according to various embodiments of the invention.

FIG. 11 illustrates an example flowchart for operation of a meta-stability glitch detector according to various embodiments of the invention. Referring to FIG. 11, in a block 1101, a meta-stability glitch detector can sample an output of a storage element. In some examples, the meta-stability glitch detector can receive the output from a capture device located in electronic device implemented by a programmable logic device. The storage element can latch data in response to a clock signal and provide the latched data to the meta-stability glitch detector as the output. When the capture device latches data that has not settled, i.e., arrived too late to satisfy a set-up time requirement of the capture device, the output of the capture device can become meta-stable for an unbounded time period, which can introduce glitches into the electronic device.

The meta-stability glitch detector can include a sampling circuit, such as a latch, to latch or sample the output, for example, in response to the clock signal. In some embodiments, when the storage element provides the output to the meta-stability glitch detector on a rising edge of the clock signal, the sampling circuit can sample or latch the output on a preceding falling edge of the clock signal.

In a block 1102, the meta-stability glitch detector can monitor the output of the storage element over time to determine whether the output differs from the sampled output of the storage element. In some embodiments, the meta-stability glitch detector can include a mono-shot circuit to compare the output from the storage element with the sampled output. Thus, when the output is meta-stable and resolves or changes value after having been sampled, the mono-shot circuit can detect the value change in the output and equate that value change to the meta-stability of the output.

In a block 1103, the meta-stability glitch detector can generate a pulse based, at least in part, on the determination that the output of the storage element differs from the sampled output. In some embodiments, the mono-shot circuit can generate a pulse when the output and the sampled output differ in value. The pulse can be a short signal burst, for example, which can cause a clock-driven device in the meta-stability glitch detector to initiate an operation, such as a latching operation.

In a block 1104, the meta-stability glitch detector can output a glitch signal in response to the pulse from the mono-shot circuit. The meta-stability glitch detector can generate the glitch signal, for example, from the sampled output, and output the glitch signal in response to the pulse. In some embodiments, the meta-stability glitch detector can include a drive circuit to receive the sampled output from the sampling circuit and generate a glitch signal based on the sampled output. For example, the drive circuit can include logic circuitry, such as an inverter, to generate the glitch signal by inverting the sampled output. The drive circuit can selectively output the glitch signal in response to the pulse. In some embodiments, the drive circuit can include a latch or other storage element to capture the inversion of the sampled output from the inverter in response to the pulse, and to output the inversion of the sampled output as the glitch signal.

In a block 1105, the meta-stability glitch detector can generate an error signal when the sampled output differs from the glitch signal. In some embodiments, the meta-stability glitch detector can include an error detection circuit to compare the sampled output with the glitch signal, and generate the error signal when the sampled output and the glitch signal differ in value. Since the glitch signal can be the inversion of the sampled output, for example, when the mono-shot circuit detects meta-stability in the output, the error detection circuit can output the error signal to annunciate a presence of meta-stability in the output after a time period that it should have been resolved.

The system and apparatus described above may use dedicated processor systems, micro controllers, programmable logic devices, microprocessors, or any combination thereof, to perform some or all of the operations described herein. Some of the operations described above may be implemented in software and other operations may be implemented in hardware. Any of the operations, processes, and/or methods described herein may be performed by an apparatus, a device, and/or a system substantially similar to those as described herein and with reference to the illustrated figures.

The processing device may execute instructions or "code" stored in memory. The memory may store data as well. The processing device may include, but may not be limited to, an analog processor, a digital processor, a microprocessor, a multi-core processor, a processor array, a network processor, or the like. The processing device may be part of an integrated control system or system manager, or may be provided as a portable electronic device configured to interface with a networked system either locally or remotely via wireless transmission.

The processor memory may be integrated together with the processing device, for example RAM or FLASH memory disposed within an integrated circuit microprocessor or the like. In other examples, the memory may comprise an independent device, such as an external disk drive, a storage array, a portable FLASH key fob, or the like. The memory and processing device may be operatively coupled together, or in communication with each other, for example by an I/O port, a network connection, or the like, and the processing device may read a file stored on the memory. Associated memory may be "read only" by design (ROM) by virtue of permission settings, or not. Other examples of memory may include, but may not be limited to, WORM, EPROM, EEPROM, FLASH, or the like, which may be implemented in solid state semiconductor devices. Other memories may comprise moving parts, such as a known rotating disk drive. All such memories may be "machine-readable" and may be readable by a processing device.

Operating instructions or commands may be implemented or embodied in tangible forms of stored computer software (also known as "computer program" or "code"). Programs, or code, may be stored in a digital memory and may be read by the processing device. "Computer-readable storage medium" (or alternatively, "machine-readable storage medium") may include all of the foregoing types of memory, as well as new technologies of the future, as long as the memory may be capable of storing digital information in the nature of a computer program or other data, at least temporarily, and as long at the stored information may be "read" by an appropriate processing device. The term "computer-readable" may not be limited to the historical usage of "computer" to imply a complete mainframe, mini-computer, desktop or even laptop computer. Rather, "computer-readable" may comprise storage medium that may be readable by a processor, a processing device, or any computing system. Such media may be any available media that may be locally and/or remotely accessible by a computer or a processor, and may include volatile and non-volatile media, and removable and non-removable media, or any combination thereof.

A program stored in a computer-readable storage medium may comprise a computer program product. For example, a storage medium may be used as a convenient means to store or transport a computer program. For the sake of convenience, the operations may be described as various interconnected or coupled functional blocks or diagrams. However, there may be cases where these functional blocks or diagrams may be equivalently aggregated into a single logic device, program or operation with unclear boundaries.

CONCLUSION

While the application describes specific examples of carrying out embodiments of the invention, those skilled in the art will appreciate that there are numerous variations and permutations of the above described systems and techniques that fall within the spirit and scope of the invention as set forth in the appended claims. For example, while specific terminology has been employed above to refer to electronic design automation processes, it should be appreciated that various examples of the invention may be implemented using any desired combination of electronic design automation processes.

One of skill in the art will also recognize that the concepts taught herein can be tailored to a particular application in many other ways. In particular, those skilled in the art will recognize that the illustrated examples are but one of many alternative implementations that will become apparent upon reading this disclosure.

Although the specification may refer to "an", "one", "another", or "some" example(s) in several locations, this does not necessarily mean that each such reference is to the same example(s), or that the feature only applies to a single example.

The invention claimed is:

1. A system comprising:
a sampling circuit configured to sample an output of a storage element;
a mono-shot circuit configured to monitor the output of the storage element and to generate a pulse when the monitored output of the storage element differs from the sampled output;
a drive circuit configured to generate a glitch signal based, at least in part, on the sampled output, and to output the glitch signal in response to the pulse from the mono-shot circuit; and
an error detection circuit configured to receive the sampled output from the sampling circuit and the glitch signal from the drive circuit, and to generate an error signal when the sampled output differs from the glitch signal.

2. The system of claim 1, wherein the error signal is configured to annunciate a presence of meta-stability in the output of the storage element.

3. The system of claim 2, wherein the error detection circuit is configured to reset at least one of the sampling circuit, the mono-shot circuit, the drive circuit, and portions of the error detection circuit when the error signal indicates the presence of meta-stability in the output of the storage element.

4. The system of claim 1, wherein the mono-shot circuit further comprising:
logic circuitry configured to compare the output of the storage element with the sampled output, and to generate a toggle signal when the output of the storage element differs from the sampled output; and
a latch unit configured to output the pulse in response to the toggle signal.

5. The system of claim 1, wherein the drive circuit further comprising:
logic circuitry configured to invert the sampled output; and
a latch unit configured to output the inverted version of the sampled output as the glitch signal in response to the pulse.

6. The system of claim 1, wherein the storage element is configured to generate the output in response to a first edge of a clock signal, wherein the sampling circuit includes a latch unit configured to sample the output of the storage element in response to a second edge of the clock signal, and wherein the first edge of the clock signal and the second edge of the clock signal occur less than a full clock period of each other.

7. The system of claim 1, further comprising:
an electronic device configured to perform electrical operations; and
a validation system configured to monitor one or more trace signals associated with the electronic device, wherein the validation system includes the sampling circuit, the mono-shot circuit, the drive circuit, and the error detection circuit to generate the error signal in response to a meta-stable glitch in the output of the storage element associated with the electronic device, and wherein the validation system is configured to transmit the trace signals associated with the electronic device for debugging in response to the error signal.

8. A method comprising:
sampling, by a meta-stability glitch detection circuit, an output of a storage element;
monitoring, by the meta-stability glitch detection circuit, the output of the storage element over time to determine whether the output differs from the sampled output of the storage element;
generating, by the meta-stability glitch detection circuit, a pulse based, at least in part, on the determination that the output of the storage element differs from the sampled output;
outputting, by the meta-stability glitch detection circuit, a glitch signal in response to the pulse; and
generating, by the meta-stability glitch detection circuit, an error signal when the sampled output differs from the glitch signal.

9. The method of claim 1, wherein the error signal is configured to annunciate a presence of meta-stability in the output of the storage element.

10. The method of claim 1, further comprising generating, by the meta-stability glitch detection circuit, the glitch signal based, at least in part, on the sampled output.

11. The method of claim 10, wherein generating the glitch signal further comprises inverting the sampled output.

12. The method of claim 1, wherein monitoring the output of the storage element over time further comprises comparing the output of the storage element with the sampled output, and wherein the method further comprising generating, by the meta-stability glitch detection circuit, a toggle signal when the output of the storage element differs from the sampled output.

13. The method of claim 12, wherein generating the pulse is performed in response to the toggle signal.

14. A system comprising:
  means for sampling an output of a storage element;
  means for monitoring the output of the storage element over time to determine whether the output differs from the sampled output of the storage element;
  means for generating a pulse based, at least in part, on the determination that the output of the storage element differs from the sampled output;
  means for outputting a glitch signal in response to the pulse; and
  means for generating an error signal when the sampled output differs from the glitch signal.

15. The system of claim 14, wherein the error signal is configured to annunciate a presence of meta-stability in the output of the storage element.

16. The system of claim 14, further comprising means for generating the glitch signal based, at least in part, on the sampled output.

17. The system of claim 16, wherein the means for generating the glitch signal is configured to invert the sampled output.

18. The system of claim 14, wherein the means for monitoring is configured to compare the output of the storage element with the sampled output, and further comprising means for generating a toggle signal when the output of the storage element differs from the sampled output.

19. The system of claim 18, wherein the means for generating is configured to generate the pulse in response to the toggle signal.

* * * * *